United States Patent [19]

Uchiyama et al.

[11] Patent Number: 5,373,518
[45] Date of Patent: Dec. 13, 1994

[54] IMAGE FORMING APPARATUS AND CONSTANT CURRENT CIRCUIT SWITCHING DEVICE FOR USE THEREWITH

[75] Inventors: Seiji Uchiyama, Tokyo; Akio Noguchi, Ebina; Yukihide Ushio; Shimpei Matsuo, both of Tokyo; Yoji Serizawa, Yokohama; Kazuro Yamada, Tokyo; Makoto Takeuchi, Yokohama; Hiroyuki Nakamura, Atsugi, all of Japan

[73] Assignee: Canon Kabushiki Kaisha, Tokyo, Japan

[21] Appl. No.: 42,900

[22] Filed: Mar. 22, 1993

Related U.S. Application Data

[63] Continuation of Ser. No. 724,813, Jul. 2, 1991, abandoned.

[30] Foreign Application Priority Data

Jul. 5, 1990 [JP] Japan .................. 2-176244
Jul. 5, 1990 [JP] Japan .................. 2-176245
May 17, 1991 [JP] Japan .................. 3-140682

[51] Int. Cl.$^5$ ............................ H01S 3/00
[52] U.S. Cl. ........................ 372/38; 372/26; 372/29; 372/31; 372/32
[58] Field of Search .............. 372/38, 26, 29, 31, 372/32

[56] References Cited

U.S. PATENT DOCUMENTS

| | | | |
|---|---|---|---|
| 4,695,714 | 9/1987 | Kimizuka et al. | 250/205 |
| 4,819,242 | 4/1989 | Kaku et al. | 372/38 |
| 4,878,225 | 10/1989 | Aiba et al. | 372/38 |
| 4,899,344 | 2/1990 | Shibata et al. | 372/29 |
| 5,043,745 | 8/1991 | Inoue et al. | 346/108 |

FOREIGN PATENT DOCUMENTS 307980 3/1989 European Pat. Off. .

OTHER PUBLICATIONS

O. Wada, et al., "Monolithic Integration Of A Quantum-Well Laser And A Driver Circuit On A GaAs Substrate", International Electron Devices Meeting, 1984, pp. 520–523.

*Primary Examiner*—Georgia Y. Epps
*Attorney, Agent, or Firm*—Fitzpatrick, Cella, Harper & Scinto

[57] ABSTRACT

A driver IC for driving a light source comprises means for generating a constant current, switching means for switching the constant current supplied to the light source, first input terminal for inputting a first signal to modulate a light emitted by the light source, said switching means performing a switching operation in accordance with the first signal, and second input terminal for inputting a second signal so as to supply the constant current to the light source, irrespective of the first signal.

29 Claims, 13 Drawing Sheets

IMAGE FORMING APPARATUS AND CONSTANT CURRENT CIRCUIT SWITCHING DEVICE FOR USE THEREWITH

This application is a continuation of application Ser. No. 07/724,813 filed Jul. 2, 1991, now abandoned.

BACKGROUND OF THE INVENTION

1. Field of the Invention

The present invention relates to an image forming apparatus for forming an image by scanning a sensitized material with the laser beam modulated by an image signal.

Also, the present invention relates to a constant current circuit switching device suitably used for a semiconductor laser driving device which emits the laser beam modulated with the image signal.

2. Related Background Art

FIG. 1 is a circuit block diagram for explaining a constitution of a conventional image forming device, and its constitution and operation will be described below.

Image data expanded in an image processor 101 is transferred to a controller 102 as an image signal 104. The controller 102 performs a sequence of forming an image, as well as controlling the conveyance of printer sheets.

The controller 102 indicates the luminous energy necessary for forming the image to a laser control unit 103. This signal is a luminous energy indication signal 106. The controller 102 monitors whether or not the laser beam is emitted with a necessary luminous energy, using a luminous energy monitor signal 107, thereby raising or lowering the luminous energy indication signal 106.

The laser control unit 103 lights up a laser device with a driving current in accordance with the luminous energy indication signal 106 from the controller 102. This light-up is made at a time when a laser light-up signal 105 becomes true. The laser control unit 103 transfers the laser luminous energy to the controller 102 as the luminous energy monitor signal 107.

The image processor 101 and the controller 102 are explained as separate units, but may be constructed as the same unit.

FIG. 2 is a detail block diagram for explaining the constitution of controller 102 as shown in FIG. 1, wherein a conveyance control unit is omitted. Note that 111 is an image control signal generator.

The image signal 104 transmitted from the image processor 101 serves as an ON/OFF signal for the laser to form the image. However, the range for forming the image (range where the image signal is effective) is only within an effective region 116 as shown in FIG. 3.

FIG. 3 is an explanation view for explaining the relative relation between effective imaging region and image signal.

A slanting line portion 114 within a transfer paper 113 (paper on which the image is formed) is a region for forming the image.

Now, if the laser beam is scanning with the laser light-up signal 115, the image signal 117 at this time can be made true only within the effective region 116.

It is not necessarily assured that the image signal 117 is not made true outside of the effective region 116, because the image processor 101 is different for each apparatus. Thus, the controller 102 must be masked so that the laser light-up signal 115 does not become true outside of the effective region 116. That signal is an image formation authorized signal 109.

Also, the controller 102 outputs the luminous energy indication signal 106 in accordance with the luminous energy monitor signal 107. In this case, the laser must be forcedly caused to make a continuous emission, even if out of the effective region.

To this end, the controller 102 makes a forced light-up signal 110 true to cause the laser to make the forced emission. To form the image in this way, at least three signals, are required, namely image signal 104, image formation authorized signal 109 and forced light-up signal 110.

FIG. 4 is a circuit block diagram for explaining a detailed constitution of the laser control unit 103 as shown in FIG. 1.

The laser control unit 103, which consists of a constant current source 118, a switch 119, a laser diode 120, and a photodiode 121 for monitoring the laser luminous energy, causes the laser to emit the light with the luminous energy in accordance with the luminous energy indication signal 106. At this time, it is the laser light-up signal 105 that serves as the ON/OFF signal. Also, the luminous energy monitor signal 107 for controlling the luminous energy is created.

In the following, the operation of each unit will be described in detail.

The constant current unit 118 causes current I to follow in accordance with the luminous energy indication signal 106. This current I is caused to flow through the laser diode 120 or to the ground GND, by the switch 119.

The switch 119 acts to flow the current through the laser diode 120 or directly through to the ground GND in accordance with the state of the laser light-up signal 105. Laser luminous energy can be detected by the photodiode 121 as the current value. This current value is converted into the voltage value by a loading resistor 122 to become the luminous energy monitor signal 107.

However, in a conventional image forming apparatus, if the image signal has a higher frequency, there was a problem that the waveform was made irregular so that a bad influence was exerted on the image, e.g., image disorder might arise.

For example, in a conventional binary image, the influence of irregular waveforms exerted on the image is small because the frequency of the image signal is relatively low, whereas when an image signal containing high frequency components such as the half tone image is processed, the influence on the image is remarkable. That is, when dealing with the high frequency image signal, it is necessary to consider the image signal line as the transfer line, whereas in a conventional transfer processing, there was a problem that irregular waveforms caused due to the reflection and other factors might appear as the unevenness of density or noise such as a moire pattern on the image.

Also, in a conventional laser control unit, a high frequency image signal is transferred from the image processor 101 via a line for the image signal 104 through logical circuits 112, 108, and input via a line for the laser light-up signal 105 into the laser control unit 103. On this way, there are various factors potentially making the waveform irregular.

Though there was no problem in conventional low frequency image signals, the ratio of irregular waveforms per dot is not negligible in high-speed or high resolution machines. Particularly, when the density is represented by the size of dot (pulse width), there was a significant problem that the irregular duty ratio for image signal might exert a great influence on the density.

Moreover, in the above conventional laser control unit, there was a problem that owing to dispersion in the characteristics of switching transistor constituting the switch 119 and the current or voltage characteristics of semiconductor laser 120, the output of semiconductor laser might not coincide with the duty of the driving signal, when driven at a certain duty by the laser light-up signal 105.

In the following, this problem will be described with reference to FIGS. 5 and 6.

FIG. 5 is a circuit diagram for specifically showing the constitution corresponding to the constant current source 118, the switch 119, the semiconductor laser (laser diode) 120, the optical detector (photodiode) 121 and so on as shown in FIG. 4. FIG. 6 is a characteristic view representing one example of the current and voltage characteristics of semiconductor laser, indicating that the forward voltage is differently shown with the same current flow due to dispersion of each laser diode.

In FIG. 5, a constant current setting section consists of an operational amplifier 201, and an npn transistor 202 for receiving its output at the base and setting the constant voltage along with a resistor 210. A driving circuit is formed of a pnp current mirror component consisting of pnp transistors 203–205, and an npn current mirror component consisting of npn transistors 206–208 to which the constant current $I_{ref}$ is supplied by the pnp current mirror component. From the npn current mirror component, the constant current is supplied to the semiconductor laser 23. Resistors 211, 212 are for self-saturation, and a resistor 213 is for bias stabilization in the pnp current mirror component.

The switch 119 is formed of a level conversion circuit for receiving a modulated signal VD (corresponding to the laser light-up signal 105) and an npn transistor 209 having its output applied to the base for switching the constant current to the semiconductor laser 223.

The optical detector and APC circuit 214 is one provided with an optical sensor for detecting the light intensity of semiconductor laser 223, and means for giving the potential to the + input of the operational amplifier so as to keep the light intensity of semiconductor laser 223 constant with its output. 215 is a power line connectable to the power supply.

In the above circuit, considering the operation of the switching npn transistor 209, the npn transistor 209 operates in the breaking or saturation region to turn on/off the semiconductor laser 223, wherein there is such a property that the transistor lying in the saturation region continues to be in the on state until carriers stored in the base region due to the so-called storage effect of minority carrier disappear due to discharge. Accordingly, for the modulated signal VD, the semiconductor laser 223 has a shorter light emitting time by the period during which the transistor continues the on state. That is, there is a problem that the VD signal and the duty do not coincide. This behavior is shown in FIG. 7. As shown in the same figure, a semiconductor laser anode voltage signal causes a delay by the delay time $t_{pd}$ with respect to the modulated signal VD. Next, the operation of the pnp transistor for supplying the driving voltage will be described. If the switching npn transistor exits from the saturation state and enters the breaking state, a delay will occur by the time when the current flows through the semiconductor laser 223. This delay is the time t for charging the parasitic capacitance caused by mainly a collector of the pnp transistor 205, when the collector potential of the pnp transistor 205 is caused to rise by the amount of forward voltage of the semiconductor laser, wherein provided that the parasitic capacitance is $C_C$, the constant current flowing to the collector of the pnp transistor 205 is $I_{ref}$, and the forward voltage of the semiconductor laser is $V_F$, $$C_C \cdot V_F = I_{ref} \cdot t$$

i.e., $$t = C_C \cdot V_F / I_{ref}$$

From the above expression, it will be found that the delay time t depends on the forward voltage $V_F$ of the semiconductor laser.

This behavior is shown in FIG. 8. A further detailed explanation of FIG. 8 is as follows. Assuming that the saturation voltage of the npn transistor 209 is $V_{CE209(sat)}$ and the base-emitter voltages of the npn transistors 206, 207 are $V_{BE}206$, $V_{BE}207$, respectively, the $L_0$ level in collector potential waveform of the pnp transistor 205 of FIG. 8 is $$V_{CE209(sat)} + V_{BE}206 + V_{BE}207,$$

which is a value irrespective of $V_F$ of the semiconductor laser. Upon rising by $V_F$ above this potential, the semiconductor laser 223 will emit the light, but the charging time t becomes longer as indicated in the above expression, along with the increase of $V_F$, due to dispersion of $V_F$ as shown in FIG. 6, and as a result, there is a problem that the laser current waveform is made shorter.

As described above, for the modulated signal VD, there are factors of putting the duty out of order such as the saturation of the switching transistor, and the fluctuation of collector voltage of the pnp transistor for driving the constant current, causing a problem which cannot be avoided in conventional examples, so that the boldness or gradation of print line can not be output properly.

SUMMARY OF THE INVENTION

An object of the present invention is to resolve the above problems.

Another object of the present invention is to provide a laser control unit capable of suppressing the waveform distortion at the transfer of image information at minimum by enabling the direct transfer input from a data source into a laser driving means (driver IC).

A further object of the present invention is to provide an image forming apparatus capable of suppressing irregular waveform of a modulated signal transferred from a data source at minimum.

A still further object of the present invention is to provide a new constant current circuit switching device not depending on the storage effect of minority carrier peculiar to a transistor, and the fluctuation of collector potential (which is caused by dispersion of the forward voltage of semiconductor laser in a semiconductor laser driving device).

The reason why the problem as shown in FIGS. 7 and 8 arises is due to the fact that with the storage of minority carriers in the transistor for switching the current mirror circuit component and the fluctuation of the collector potential for the transistor for driving the constant current, the delay time $T_2$ of the rising voltage of the semiconductor laser relative to the falling voltage of modulated signal VD is significantly larger than the delay time $T_1$ of the falling voltage of the semiconductor laser relative to the rising voltage of modulated signal VD.

According to a preferred example, there is provided a circuit configuration at a base of a first transistor for switching the driving current to a semiconductor laser, having the same effect as the storage effect of minority carriers in the first switching transistor, so as to transmit the signal via the circuit. Thereby, it is possible to make the delay time $T_1$ closer to the delay time $T_2$, and obtain the voltage waveform of duty which is the same as or near to that of the modulated signal.

Other advantages and effects of the present invention will be more apparent from the detailed description and accompanied drawings and claims.

DETAILED DESCRIPTION OF THE PREFERRED EMBODIMENTS

The examples of the present invention will be now described with reference to the accompanying drawings.

FIRST EXAMPLE

Figure 9:
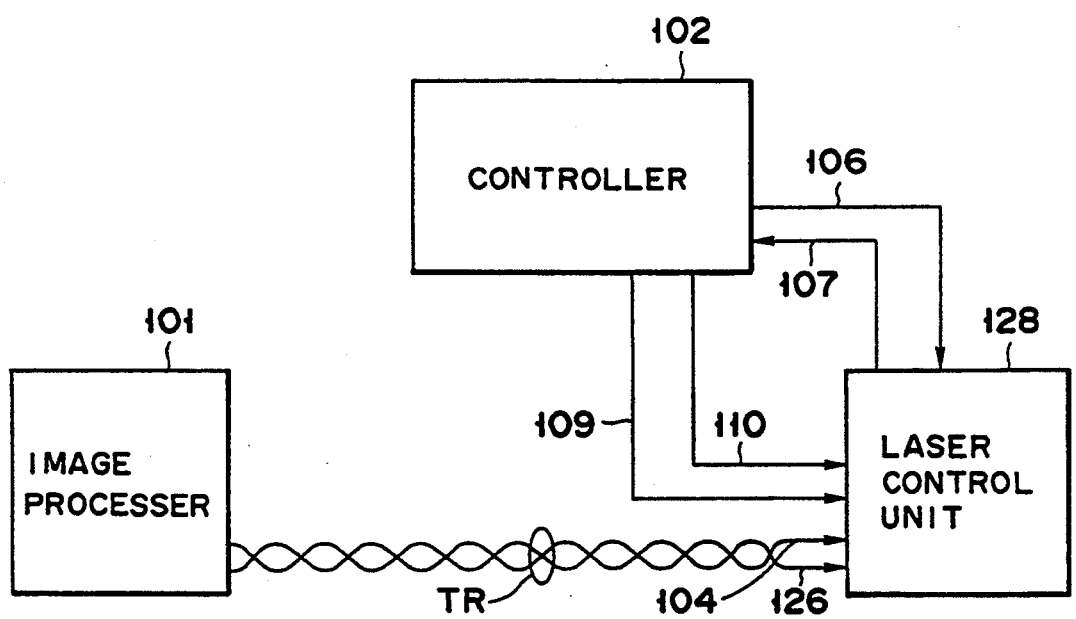
FIG. 9 is a block diagram for explaining a configuration of an image forming device as shown in a first example of this invention.

FIG. 9 is a block diagram for explaining the configuration of an image forming device in the first example of this invention, in which 101 is an image processor for expanding an image, and 102 is a controller (first unit) for controlling the image forming device, each section of which is collectively controlled based on a control program stored in ROM, etc., not shown.

128 is a laser control unit (third unit) to which the transmission medium (e.g., coaxial cable for the long distance) TR for transmitting an image signal 104 created by the image processor (second unit) 101 is connected internally or externally from the image processor (second unit) 101, so as to transfer the image signal 104 directly without any interposition of signal processing device.

106 is a luminous energy indication signal, 107 is a luminous energy monitor signal, 110 is a forced light-up signal, and 109 is an image formation authorized signal, these signals functioning as an image control signal. 126 is a ground line.

In the image forming device constructed in such a way, the image signal 104 generated in the second unit (image processor 101 in this example) is transferred only via the predetermined transmission medium TR disposed between the second unit and the third unit (laser control unit 128 in this example), in which the image signal 104 input based on the image control signals (image formation authorized signal 109, forced light-up signal 110, etc.) issued from the first unit (controller 102) is processed to cause a semiconductor laser 120 as will be described later to emit the modulated light beam.

Figure 1:
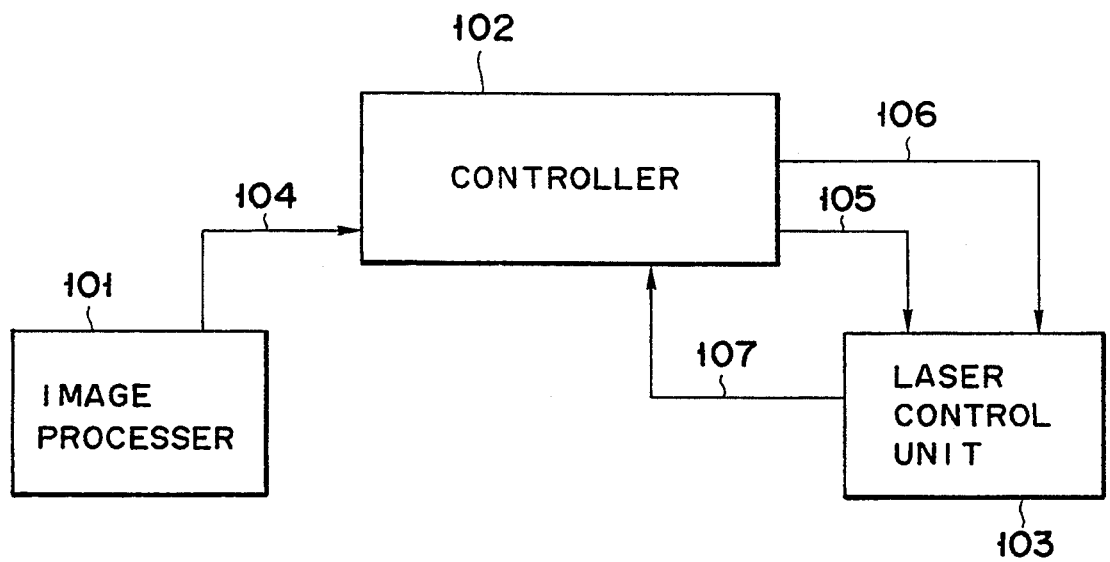
FIG. 1 is a circuit block diagram for explaining a constitution of a conventional laser control unit.
Figure 2:
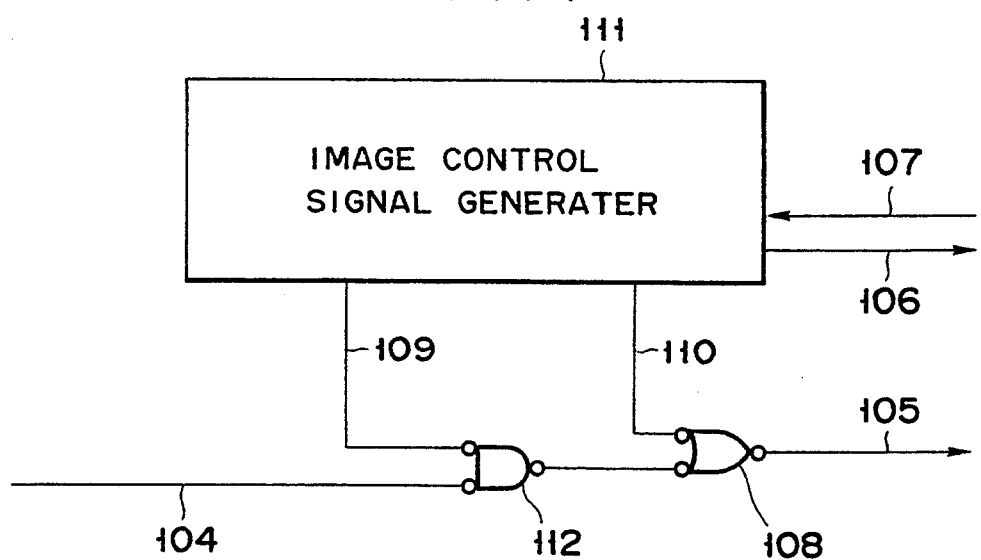
FIG. 2 is a detailed block diagram for explaining the constitution of a controller as shown in FIG. 1.
Figure 3:
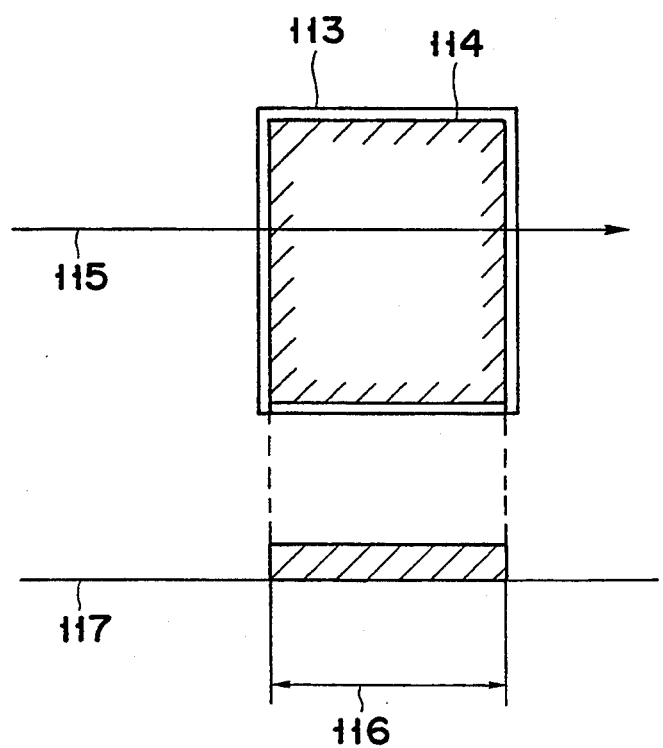
FIG. 3 is an explanation view for explaining the relative relation between effective image region and image signal.
Figure 4:
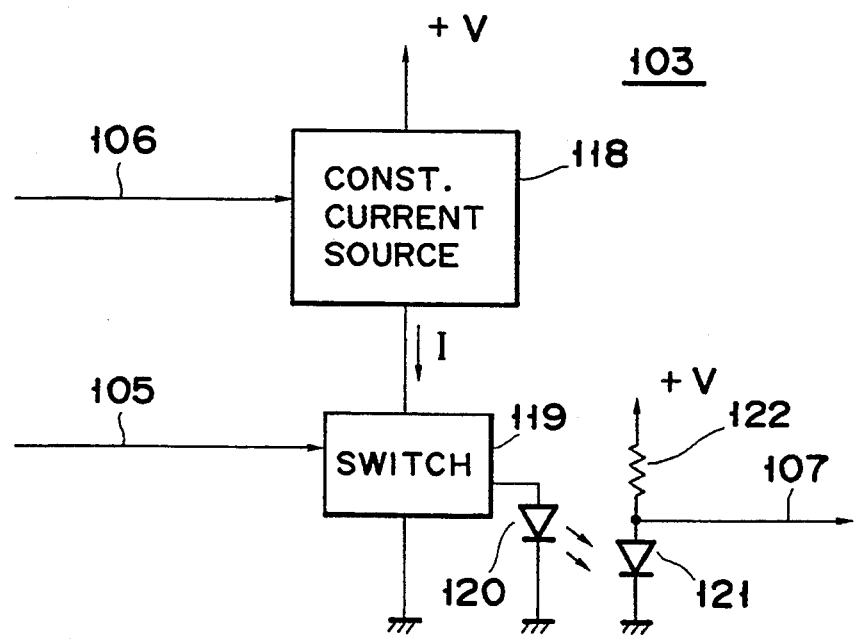
FIG. 4 is a circuit block diagram for explaining the detailed constitution of the laser control unit as shown in FIG. 1.
Figure 5:
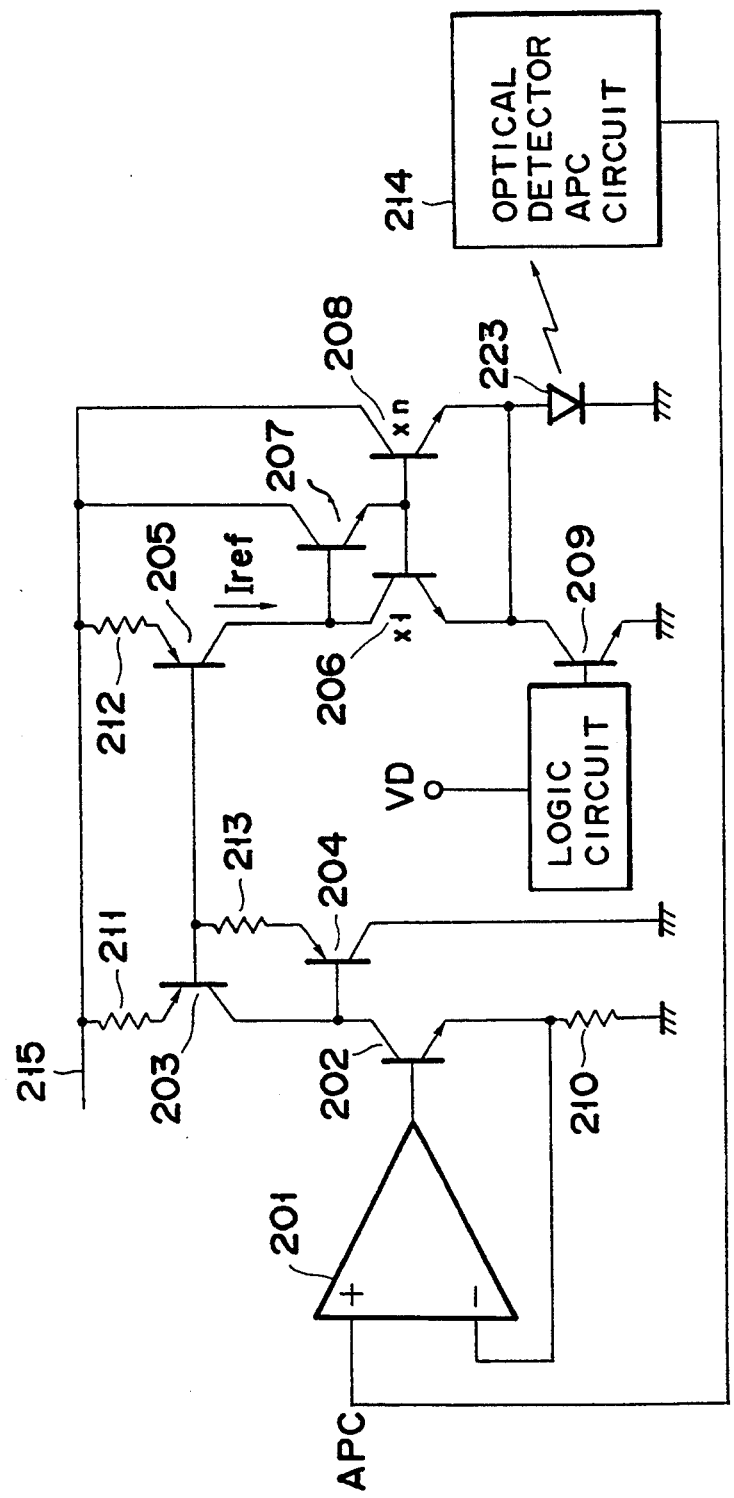
FIG. 5 is a circuit configuration diagram specifically showing another conventional technique having the same constitution as that of FIG. 4.
Figure 6:
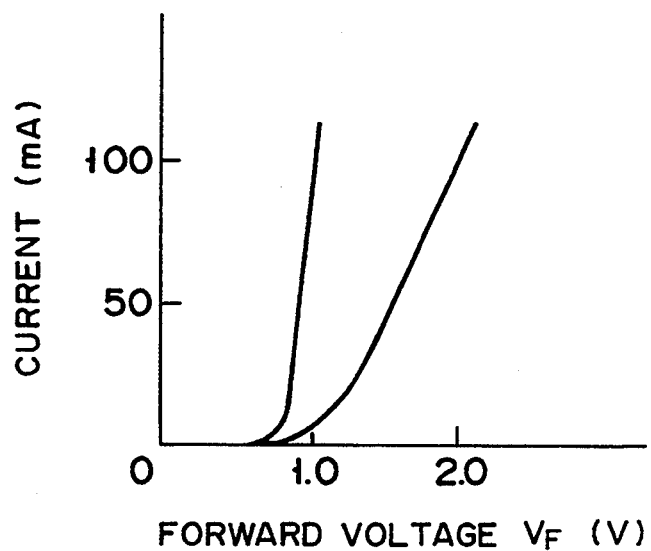
FIG. 6 is a characteristic view showing one example of current/voltage characteristics for a semiconductor laser.
Figure 7:
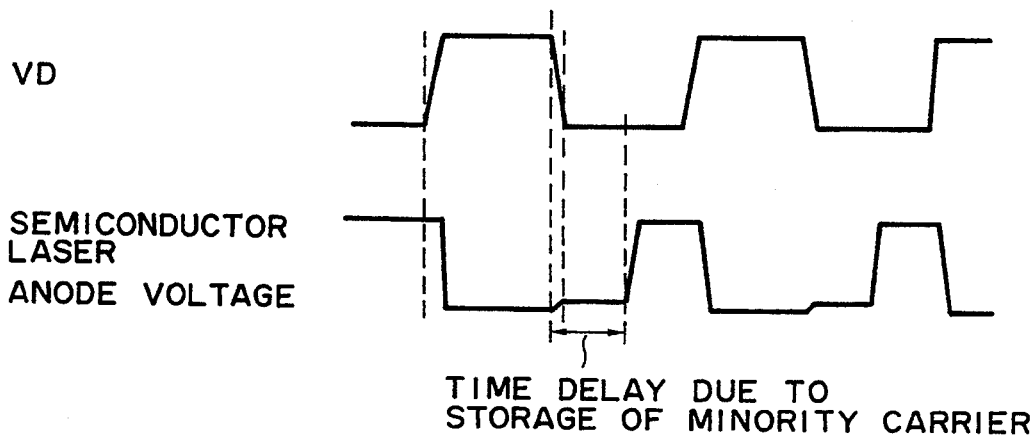
FIG. 7 is a waveform view of anode voltage of the semiconductor laser for modulated signal VD.
Figure 8:
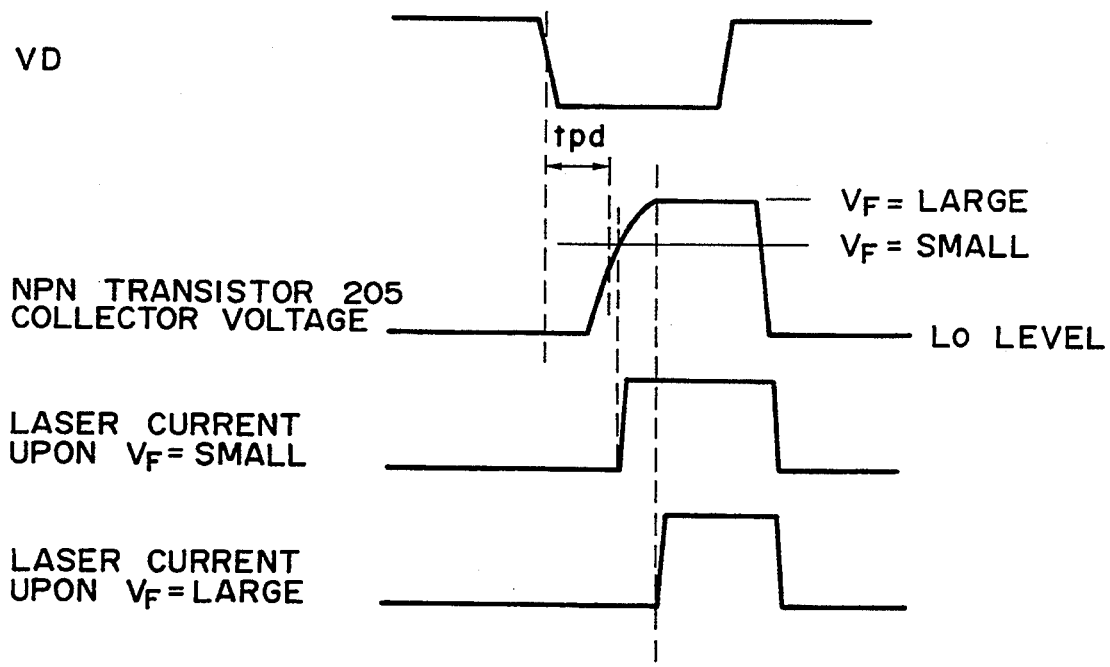
FIG. 8 is a waveform view of voltage/current of the semiconductor laser for modulated signal VD.
Figure 10:
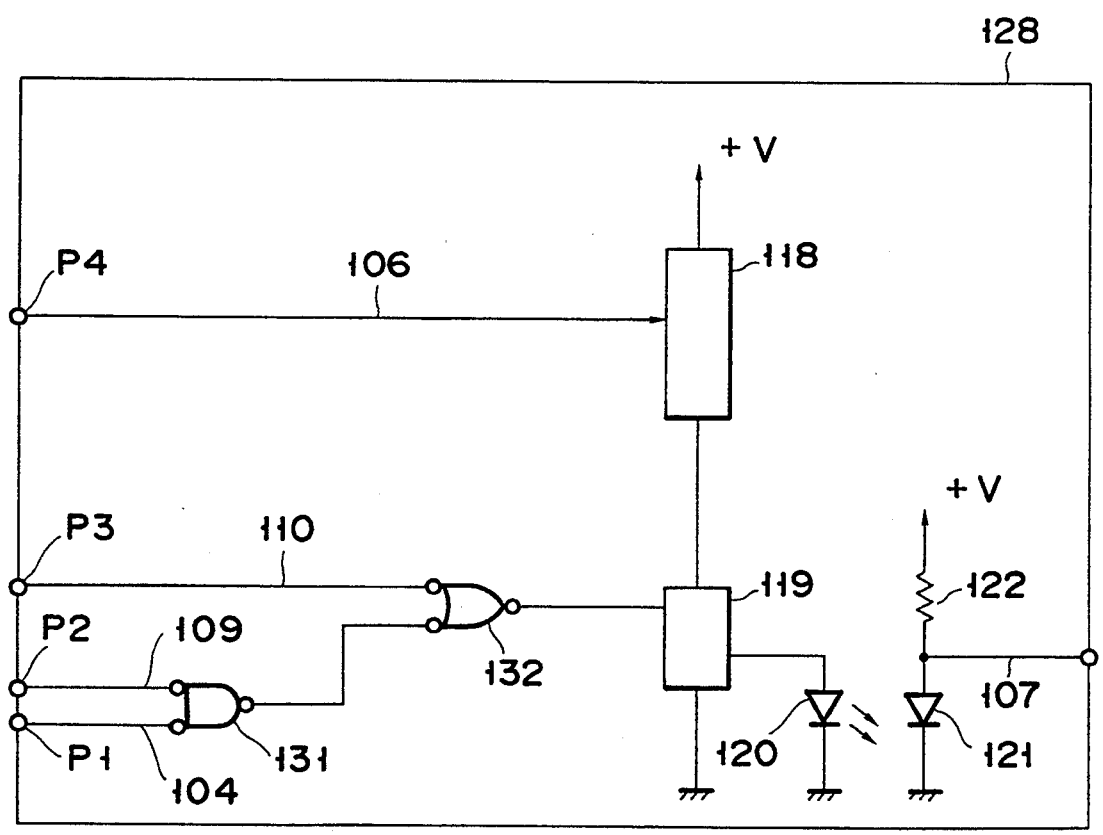
FIG. 10 is a circuit block diagram for explaining the detailed configuration of a laser control unit as shown in FIG. 9.

FIG. 10 is a circuit block diagram for explaining the detailed configuration of the laser control unit 128 as shown in FIG. 9, in which the same reference numerals are attached to the parts corresponding to those of FIG. 4, prior art (FIG. 4), the explanation will be. This example is provided with a port P1 for directly receiving the image signal 104 from the second unit, a port P2 for receiving the image formation authorized signal 109, a port P3 for receiving the forced light-up signal 110, and a port P4 for receiving the luminous energy indication signal 106. This laser control unit 128 is a laser driving IC, constructed of one-chip IC using the Bi-CMOS technique.

In this figure, 131 is a AND circuit of negative logic, for taking the logical product between image signal 104 and image formation authorized signal 109, in which the image signal does not become effective as long as the image formation authorized signal 109 is not true (active LOW).

132 is an OR circuit of negative logic for synthesizing the forced light-up signal 110 and the image signal 104. The controller 102 transfers the signal directly to the laser control unit 128, without synthesization of the image formation authorized signal 109 with the forced light-up signal 110, which has been conventionally performed internally. Note that these signals have the ground line 126, but it is omitted on the explanation.

The image signal 104 from the image processor 101 is input into the laser control unit 128 in a pair with the ground line 126. Note that this example is illustrated with a twisted pair cable, but for a short distance, the transmission medium TR such as a flat cable serves for the transmission without causing irregular waveforms. Also, when the distance between the image processor 101 and the laser control unit 128 is longer, the non-reflecting ideal signal transmission is enabled upon matching between the output impedance from the image processor 101, the characteristic impedance of coaxial cable and the input impedance of laser control unit 128, by the use of the coaxial cable as above described.

Conventionally, since the image signal 104 is processed within the controller 102, it is necessary to use a higher-rate device (integrated circuit such as a gate array) of the controller with a higher frequency of image signal 104, whereas with the above constitution, it is not necessary to provide a higher-rate section within the controller 102, and there is a cost saving by integrating it into the laser control unit 128 which has been conventionally at high rate.

While the above example was explained with an instance where the image signal 104 is directly transferred to the laser control unit 8 externally via the predetermined transmission medium TR, it can be also contemplated that using a substrate available within the controller 129 and separate from the image processing as the transmission path, the image signal 104 can be loop transferred to the laser control unit 128 via the transmission path of the above substrate.

Figure 11:
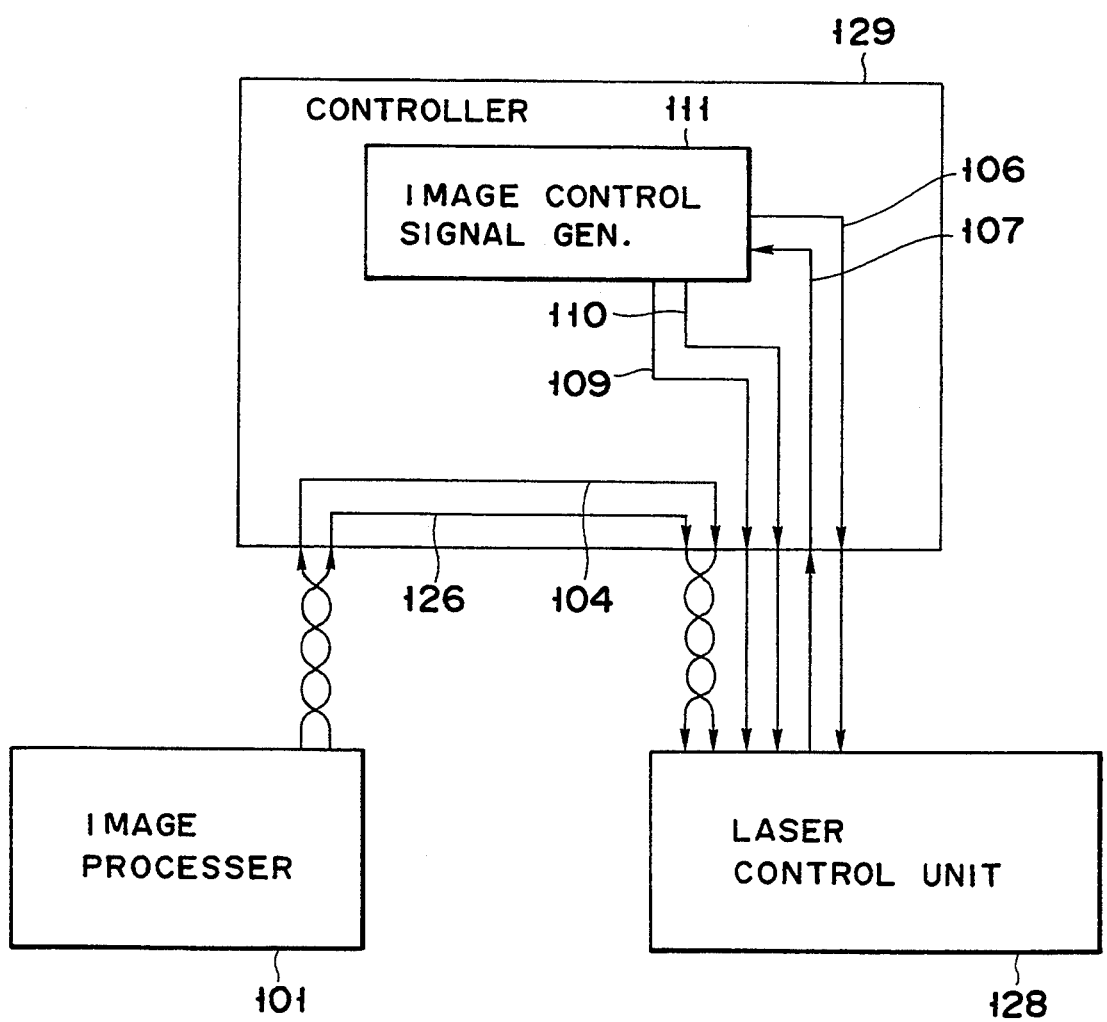
FIG. 11 is a circuit block diagram for explaining the configuration of the image forming device as shown in a variation of the first example of this invention.

FIG. 11 is a circuit block diagram for explaining the configuration of an image forming device showing a variation of the first example of this invention, in which the same numerals are attached to the same parts as in FIG. 9.

As will be clearly seen from this figure, the controller 129 is provided with an image control signal generator 111 for transferring each image control signal as above indicated via predetermined connector to the laser control unit 128.

In this case, the image signal 104 on the substrate and the ground line 126 are assigned to two selected pins of a connector of 20 to 30 pins, for example, to transfer the image signal to the laser control unit 128, or the image signal 104 and the ground line 125 are connected using a spare pin.

Thereby, the block connection between image processor 101 and controller 129, or the block connection between controller 129 and laser control unit 128 is allowed to further increase the assembly efficiency of device.

Figure 12:
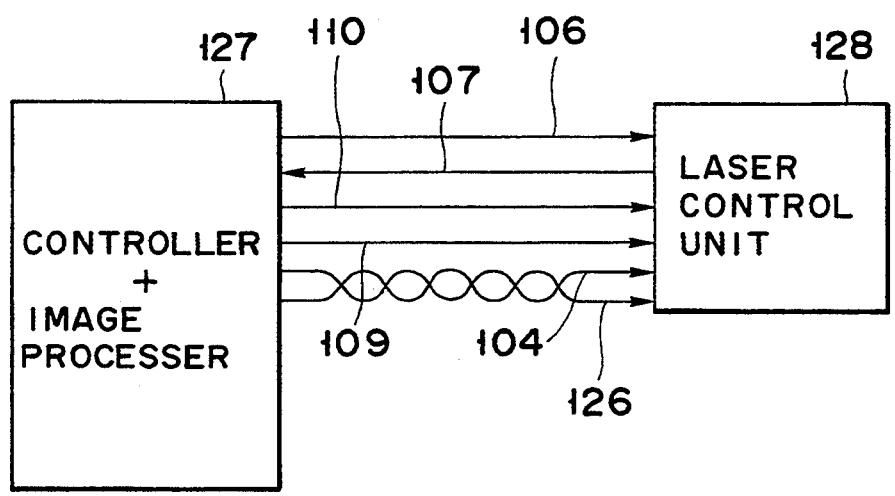
FIG. 12 is a block diagram for explaining the configuration of the image forming device as shown in another variation of the first example of this invention.

While in the above examples an image forming device having separate units of image processor 101 and controller 129 is exemplified, it should be noted that the same effect as above can be expected if the image signal 104 is directly transferred to the laser control unit 8, even with a unit in which the image processor 101 and the controller 9 are integrated as shown in FIG. 12.

Note that in this case, the image signal 104 created in the image processor unit internally provided is directly transferred to the laser control unit 128.

Figure 13:
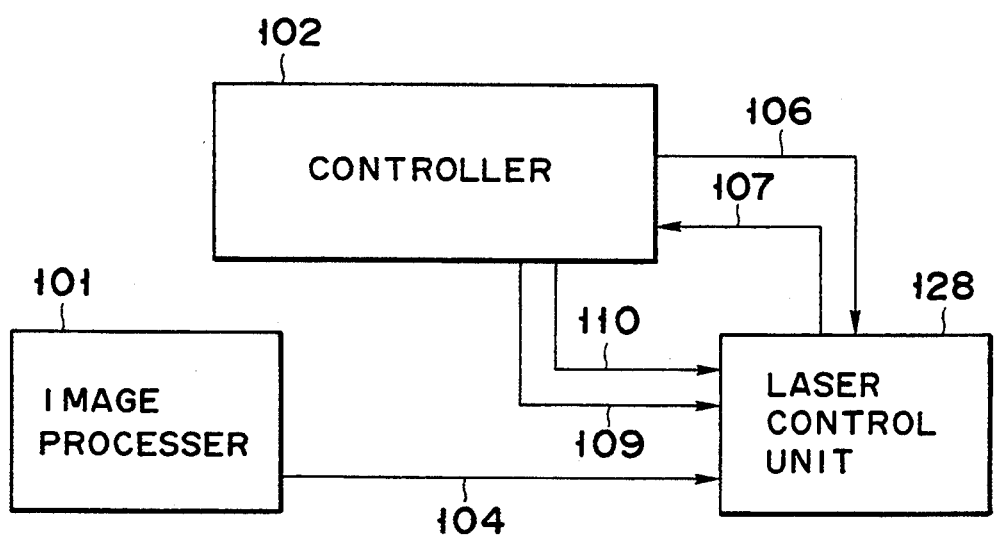
FIG. 13 is a block diagram for explaining a further variation of the first example.

Also, the shortest distance connection is allowed because the path of image signal 104 is not via the controller 102. In some cases, more reliable image formation can be effected by the transmission with the characteristic impedance controlled using the twisted pair cable or coaxial cable. FIG. 13 shows an instance where a straight cable is used.

SECOND EXAMPLE

While in the above first example, the laser control unit 128 is constructed using a standard logic IC, a second example will be described below in connection with an instance where the laser control unit is constructed by a transistor circuit.

Figure 14:
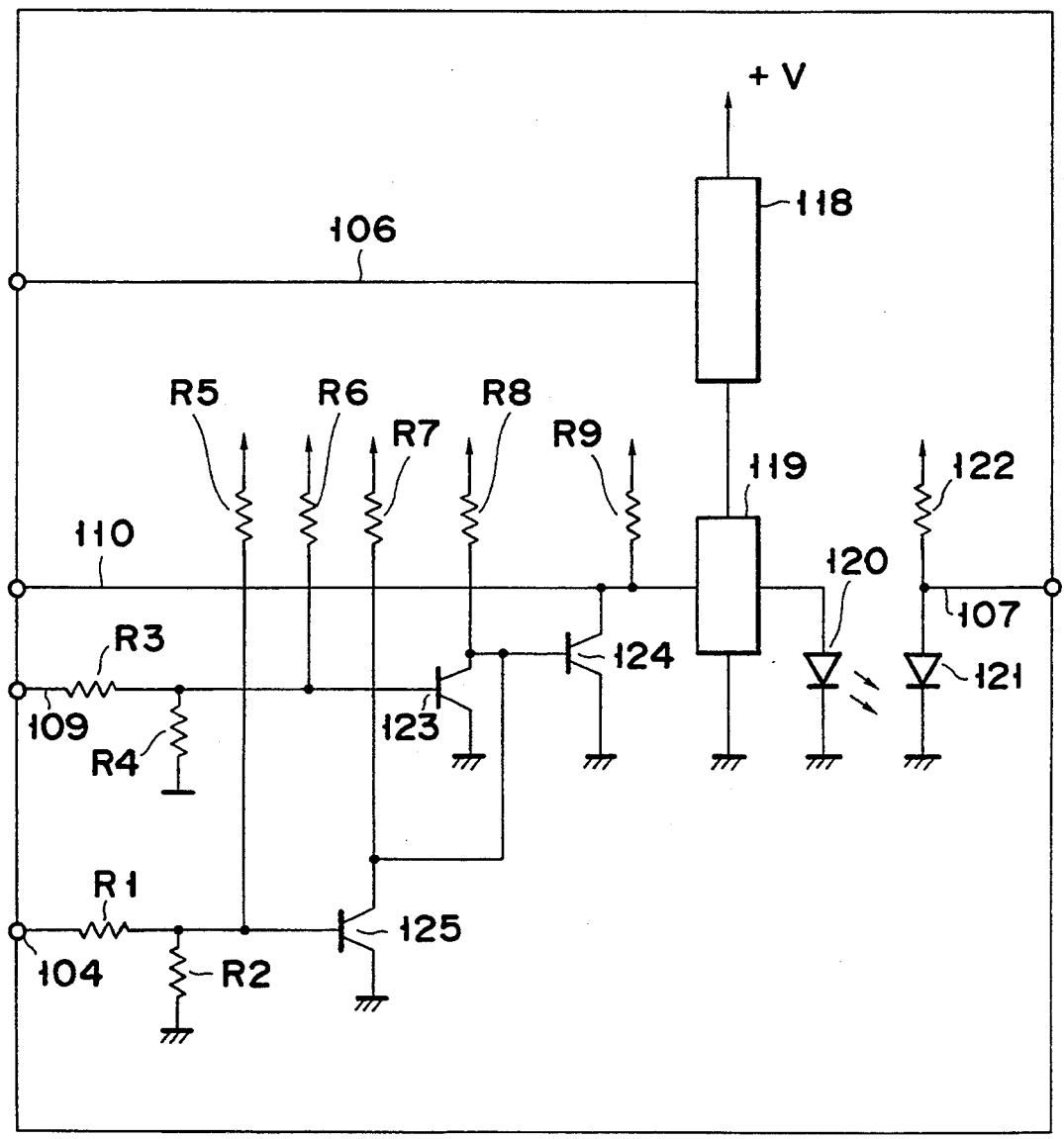
FIG. 14 is a circuit diagram for explaining a configuration of a laser control unit in a second example of this invention.

FIG. 14 is a circuit diagram for explaining the constitution of a laser control unit in the second example of this invention, in which the same numerals are attached to the same parts as in FIG. 10. Note that R1 to R9 are resistors.

As shown in this figure, an AND circuit of negative logic for the image signal 104 and the image formation authorized signal 109 is constituted using transistors 123, 125, and an OR circuit of the laser forced light-up signal 110 is formed by a transistor 4. The switch 119 permits the current to flow in a direction of lighting up the laser diode 120 if the LOW level is entered, so that it operates in the same way as in the above first example.

In this way, by integrating a portion built up by the transistors 123 to 125, the constant current source 118 and the switch 119, it is not only possible to cope with the higher frequency, but also unnecessary to contain the higher frequency signal in the controller 102, so that the controller 102 can be constructed with a lower frequency device, and the radiation noise can be reduced by adopting the coaxial cable as means for transmitting the image signal 104.

In the above first and second examples, logic circuits 131, 132 (FIG. 10) or transistors 123 to 125 (FIG. 14), the constant current source 118 and switching means 119 are constructed on the same chip using the Bi-CMOS technique, for example, but they can be constructed using a shot key TTL or bipolar transistor, or on a same substrate.

THIRD EXAMPLE

As the third example of the present invention, a constant current circuit switching device suitably used for the constitution of the constant current source 118 and the switch 119 in the above first and second examples will be described below.

A constant current driver to be switched by the constant current circuit switching device of this example is not limited to the semiconductor laser, but may be other elements or devices requiring the voltage waveform of the same or almost same duty as that of the modulated signal to be obtained, whereas there are many cases where the voltage waveform of the same or almost same duty as that of the modulated signal is sought for the driving voltage of the semiconductor laser, especially for a laser beam printer, the explanation will be made using the semiconductor laser driving device as an example in the following.

Figure 15:
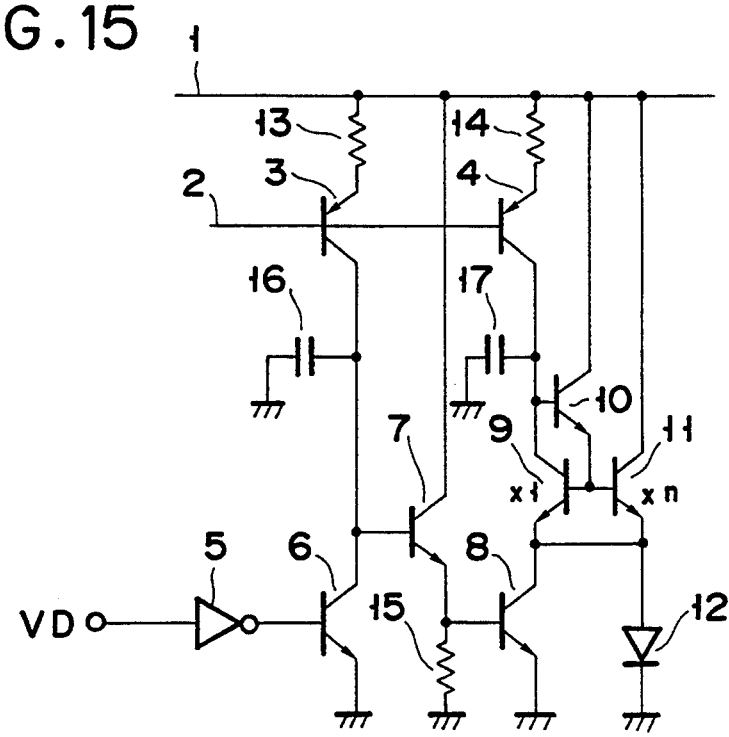
FIG. 15 is a circuit configuration view showing a third example of a semiconductor laser driving device according to the present invention.

FIG. 15 is a circuit constitutional view showing the semiconductor laser driving device (third example) to which the present invention is applied, in which 1 is a power line connectable to the power supply, 2 is a signal line for giving the bias voltage to the bases of transistors 3, 4 which supply the first and second constant currents, respectively, 5 is an inverter for receiving the modulated and driving signal, 6 is a saturable transistor which becomes a second transistor, 7 is a transistor (third transistor) as the emitter follower for driving a saturable transistor 8 (first transistor), 9, 10 and 11 are transistors constituting the current mirror in which 11 is a transistor for amplifying the current, having the size n times that of transistor 9, and 10 is a transistor for supplying the base current to transistors 9, 11, 12 is a semiconductor laser, 13 and 14 are self-saturation resistors for the transistors 3, 4 supplying the constant current, 15 is a bias resistor for the transistor 8 which is the first transistor, 16 and 17 are parasitic capacitors provided to the collectors of transistors 3, 4 supplying the second and first constant currents.

If a high level signal is input for the modulated and driving signal VD, the transistor 6 is cut off by the inverter 5, and the collector potential of the transistor 3 supplying the second constant current is varied from the saturation voltage of transistor 6 to the potential at which the transistors 7, 8 operate, until the parasitic capacitor 16 is charged. The transistor 8 reaches the saturation region rapidly from the cut-off region to turn off the semiconductor laser 12. Accordingly, the delay time $t_1$ for the semiconductor laser 12 to turn from on to off state is the total time of the delay time $t_{pd1}$ passed from the saturation state of transistor 6 to the extinction of minority carriers and the time $t_{up1}$ for charging the parasitic capacitor 16.

Next, the modulated signal VD is turned from high to low level, the transistor 6 transfers rapidly from the cut-off state to the saturation state by the inverter 5. Accordingly, the transistor 7 transfers from the active state to the cut-off state, while the transistor 8 transfers from the saturation state to the cut-off state. Accordingly, the delay time $t_2$ for the semiconductor laser 12 to change from off to on state is the total time of the delay time passed from the saturation state of transistor 8 to the extinction of minority carriers, and the time $t_{up2}$ for charging the parasitic capacitor 17 from the collector potential of transistor 4 supplying the first constant current to the base to emitter voltage of transistors 9, 10 to the potential for supplying the forward voltage $V_F$ to the semiconductor laser 12.

That is, for signals at the high and low levels of the modulated signal VD, the laser outputs of the semiconductor laser 12 are such that $t_1=t_{tp1}+t_{up1}$ and $t_2=t_{pd2}+t_{up2}$, respectively. Here, by using the same size of saturable transistors 6 and 8, $t_{pd1}=t_{pd2}$ can be obtained. The difference between $t_{up1}$ and $t_{up2}$ is a difference between the time for charging the parasitic capacitor 16 up to the base to emitter potential of transistors 7, 8 and the time for charging the parasitic capacitor 17 up to the forward voltage of the semiconductor laser 12, which is equivalent to a difference between the base to emitter voltage of two transistors 7, 8, i.e., about 1.4 V and the dispersion of the forward voltage of the semiconductor laser 12, i.e., the $V_F$ of about 1 to 2 V, whereby it will be found that $t_{up1}=t_{up2}$. Accordingly, for the modulated signal VD, the on/off of the laser output can be made to have almost the same delay time, so as to reduce the inaccuracies of duty.

FOURTH EXAMPLE

Figure 16:
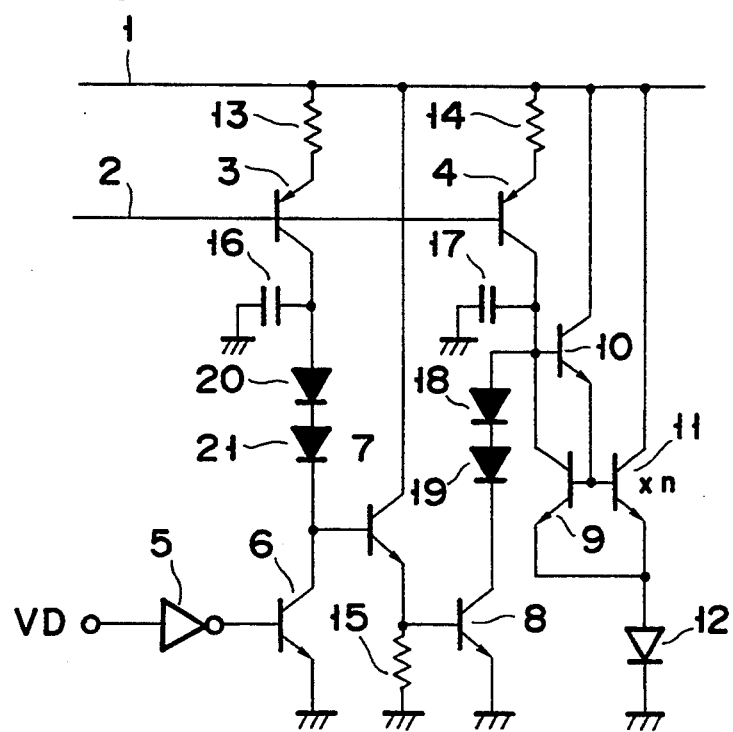
FIG. 16 is a circuit configuration view showing a fourth example of a semiconductor laser driving device according to the present invention.

FIG. 16 is a circuit configuration diagram showing the fourth example of a semiconductor laser driving device to which the present invention is applied. Note that the same numerals are attached to the same parts as in the first example as previously described, and the explanation will be omitted.

This is a case in which the first constant current for controlling a transistor 8 that is the first transistor is derived not from the output of a current mirror consisting of transistors 9, 10, 11, but from the collector of a pnp transistor 4 on the input side. 18, 19 are diodes inserted to reduce the collector potential variation of the transistor 4, in which when the transistor 8 is turned on, the consumed current can be reduced as compared with the first example, and 20, 21 are diodes inserted to the collector of a pnp transistor 3 supplying the second constant current, in which the collector potential variations of the pnp transistors 4, 3 supplying the first and second constant currents can be made equal in not only the variation widths but also the absolute values, so that more accurate duty can be obtained. This also applies to the first example, in which the same effects can be also obtained in a case where diodes 20, 21 are inserted into the collector of the pnp transistor 3 supplying the second constant current.

By providing the diodes 20, 21 as shown in FIG. 16, the collector potential of the pnp transistor 3 varies from $$V_{CE6(sat)}+V_{F20}+V_{F21} \tag{1}$$

to $$V_{BE7}+V_{BE8}+V_{F20}+V_{F21} \tag{2}$$

Where $V_{CE6(sat)}$ is a saturation voltage of the transistor 6, $V_{F20}$, $F_{F21}$ are forward voltages of the diodes 20, 21, and $V_{BE7}$, $V_{BE8}$ are base to emitter voltages of the transistors 7, 8.

On the other hand, the collector potential of the pnp transistor 4 varies from $$V_{CB8(sat)}+V_{F18}+V_{F19} \tag{3}$$

to $$V_F+V_{BE10}+V_{BE11} \tag{4}$$

Where $V_{CE8(sat)}$ is a saturation voltage of the transistor 8, $V_{F18}$, $V_{F19}$ are forward voltages of the diodes 18, 19, $V_{BE10}$, $V_{BE11}$ are base to emitter voltages of the transistors 10, 11, and $V_F$ is a forward voltage (ON voltage) of the semiconductor laser.

Here, since $V_{CE6(sat)}=V_{CE8(sat)}$, $V_{F20}=V_{F21}=V_{F18}=V_{F19}$, $V_{BE7}=V_{BE8}=V_{BE10}=V_{F11}$, the collector fluctuating potentials can be made almost equal as long as $V_F=V_{F20}+V_{F21}$.

In this way, if a plurality of diodes are provided between the transistor 3 and the transistor 6, corresponding to the forward voltage (ON voltage) of the semiconductor laser, the collector fluctuating potentials can be made almost equal.

As above described, with the constant current circuit switching device in the above example, it is possible to obtain the voltage waveform of the same or almost same duty as that of the modulated signal by transmitting the signal to a base of the first transistor for switching the driving current to a constant current driver (a semiconductor laser for the semiconductor laser driving device) to which the driving current is supplied by a current mirror circuit component, via a circuit component having the storage effect of minority carriers in the above first switching transistor.

It should be noted that in the above constant current circuit switching device, more precise duty can be obtained if a plurality of diodes are inserted between the second transistor and a supply source supplying the second constant current.

Also, in the above constant current circuit switching device, more precise duty can be obtained with a circuit configuration (in which a constant current source supplying the first constant current and a constant current source supplying the second constant current are made with same constitution, and the first transistor is switched via the third transistor controlled by the second constant current) having the similar collector potential fluctuation, as well as the storage effect of minority carriers of the first switching transistor.

While in the third and fourth examples, only the constitution associated with the constant current source and switching means was explained, it is to be noted that when applying it to the first and second examples, the constitution corresponding to the logic circuits 131, 132 (FIG. 10) or transistors 123 to 125 (FIG. 14) is provided on the same chip or board.

The present invention is not limited to the above examples, but various variations can be made within the scope of claims, which lie within the range of the present invention.

We claim:

1. A driver IC for driving a light source comprising:
   generating means for generating a constant current;
   switching means for switching the constant current so as to be supplied to the light source;
   a first input terminal functionally connected to said switching means for inputting a first signal to modulate light emitted by the light source, said switching means performing a switching operation in accordance with the first signal; and
   a second input terminal functionally connected to said switching means for inputting a second signal so as to supply the constant current to the light source, irrespective of the first signal.

2. The driver IC according to claim 1, further comprising a third input terminal functionally connected to said switching means for inputting a third signal so as to cut the constant current supplied to the light source, irrespective of the first signal.

3. The driver IC according to claim 1, further comprising a fourth input terminal functionally connected to said generating means for inputting an analog control signal, wherein said generating means generates the current supplied to said light source in accordance with the analog control signal.

4. A laser control unit for modulating a light beam emitted from a semiconductor laser based on image information, comprising:
   first input means for inputting image information for modulating the light beam, the image information being directly transferred from a data source via a predetermined transmission medium; and
   second input means for inputting an image control signal which controls modulation by the image information.

5. The laser control unit according to claim 4, further comprising:
   process means for processing the image information and the image control signal;
   generating means for generating a drive current to be supplied to said semiconductor laser; and
   means for switching the supply to said drive current to the semiconductor laser based on an output signal of said process means.

6. The laser control unit according to claim 4, wherein said image control signal is an image formation authorized signal for authorizing the modulation with said image information.

7. The laser control unit according to claim 4, wherein said image control signal is a forced light-up signal for forcedly lighting up the semiconductor laser.

8. The laser control unit according to claim 5, wherein said process means has a standard logic circuit.

9. The laser control unit according to claim 5, wherein said process means is constituted of transistors.

10. The laser control unit according to claim 5, wherein said laser control unit is made on a single substrate.

11. The laser control unit according to claim 5, wherein said laser control unit is a one-chip integrated circuit.

12. The laser control unit according to claim 4, wherein said predetermined transmission medium is a twisted pair cable.

13. The laser control unit according to claim 4, wherein said predetermined transmission medium is a coaxial cable.

14. The laser control unit according to claim 4, wherein said predetermined transmission medium is a straight cable.

15. An image processing apparatus comprising:
   a first unit for generating an image control signal;
   a second unit for generating an image signal;
   a third unit for generating a drive signal for a light source based on said image signal and said image control signal; and
   a transmission medium for directly transferring said image signal between the second and third units;
   wherein said third unit has means for processing the image signal and the image control signal.

16. The image processing apparatus according to claim 15, wherein said predetermined transmission medium is a twisted pair cable.

17. The image processing apparatus according to claim 15, wherein said predetermined transmission medium is a coaxial cable.

18. The image processing apparatus according to claim 15, wherein said predetermined transmission medium is a straight cable.

19. The image processing apparatus according to claim 15, wherein said third unit further includes means for generating a constant current to be supplied to the light source, and means for switching the constant current to the light source based on the image signal, and is made on a single substrate.

20. The image processing apparatus according to claim 15, wherein said third unit further includes means for generating a constant current to be supplied to the light source, and means for switching the constant current to the light source based on the image signal, and is formed as an one-chip IC.

21. The image processing apparatus according to claim 15, wherein said second unit is provided outside of a body of the apparatus.

22. The image processing apparatus according to claim 15, wherein said first and second units are constituted as a single unit.

23. A driver apparatus for switching a supply current to a driving object based on an input signal, comprising:
   a first constant current source for generating a first constant current;

a second constant current source for generating a second constant current;

first switching means for switching the supply of said first constant current to said driving object; and second switching means for switching said second constant current in accordance with said input signal;

wherein said first switching means performs the switching operation in accordance with the switching state of said second switching means.

24. The driver apparatus according to claim 23, wherein said first switching means has a current mirror circuit.

25. The driver apparatus according to claim 23, wherein said second switching means has transistors.

26. The driver apparatus according to claim 23, wherein said first constant current is substantially equal to said second constant current.

27. The driver apparatus according to claim 23, wherein a constant voltage source is interposed between said first current source and a ground level and/or between said second constant current source and the ground level.

28. The driver apparatus according to claim 27, wherein said constant voltage source is one or more diodes.

29. The driver apparatus according to claim 23, further comprising third switching means for switching in accordance with the switching state of said second switching means, wherein said first switching means performs the switching in accordance with the switching state of said third switching means.

* * * * *

UNITED STATES PATENT AND TRADEMARK OFFICE
CERTIFICATE OF CORRECTION

PATENT NO. : 5,373,518

DATED : December 13, 1994

INVENTOR(S) : Seiji Uchiyama, et al.

It is certified that error appears in the above-identified patent and that said Letters Patent is hereby corrected as shown below:

Column 2, line 12, after "signals" delete ",";
       line 30, change "follow" to --flow--; and
       line 63, change "On" to --In--.

Column 6, line 45, delete ", prior art (FIG. 4), the explanation will be"; and
       line 55, change "a" to --an--.

Column 8, line 37, change "shot key" to --Schottky--.

Column 9, line 4, change "9, 11," to --9 and 11,--;
       line 21, change "$t_{pd\ell}$" to --$t_{pd1}$--;
       line 23, change "$t_{up\ell}$" to --$t_{up1}$--;
       line 26, change "level, the" to --level and the--;

line 42, change "$t_1 = t_{tp\ell} + t_{up\ell}$" to --$t_1 = t_{pd1} + t_{up1}$--;

line 44, change "$t_{pd\ell} = t_{pd2}$" to --$t_{pd1} = t_{pd2}$-- line 45, change "$t_{up\ell}$" to --$t_{up1}$--; and
       line 54, change "$t_{up\ell} = t_{up2}$." to --$t_{up1} = t_{up2}$--.

UNITED STATES PATENT AND TRADEMARK OFFICE
CERTIFICATE OF CORRECTION

PATENT NO. : 5,373,518
DATED : December 13, 1994
INVENTOR(S) : Seiji Uchiyama, et al.

It is certified that error appears in the above-identified patent and that said Letters Patent is hereby corrected as shown below:

Column 10, line 21, change "$V_{CS6(sat)}$" to --$V_{CE6(sat)}$--;
line 28, change "$F_{I21}$" to --$V_{I21}$--;
line 34, change "$V_{CB8(sat)}$" to --$V_{CE8(sat)}$--; and
line 47, change "$V_{FI1}$," to --$V_{BE11}$,--.

Signed and Sealed this

Thirtieth Day of May, 1995

Attest:

BRUCE LEHMAN

*Attesting Officer*  *Commissioner of Patents and Trademarks*